(12) United States Patent
Yagi

(10) Patent No.: US 7,890,911 B2
(45) Date of Patent: Feb. 15, 2011

(54) SKELETON GENERATION APPARATUS AND METHOD

(75) Inventor: Hiroyuki Yagi, Kanagawa (JP)

(73) Assignee: Sony Corporation, Tokyo (JP)

( * ) Notice: Subject to any disclaimer, the term of this patent is extended or adjusted under 35 U.S.C. 154(b) by 490 days.

(21) Appl. No.: 11/805,141

(22) Filed: May 22, 2007

(65) Prior Publication Data

US 2007/0277143 A1    Nov. 29, 2007

(30) Foreign Application Priority Data

May 24, 2006    (JP) .............................. 2006-143662

(51) Int. Cl.
*G06F 17/50*    (2006.01)
(52) U.S. Cl. ............................. 716/18; 716/11; 716/12; 703/14
(58) Field of Classification Search .................. 716/11, 716/12, 18
See application file for complete search history.

(56) References Cited

U.S. PATENT DOCUMENTS 5,815,402 A * 9/1998 Taylor et al. ................... 716/12
6,470,478 B1 * 10/2002 Bargh et al. .................... 716/4

FOREIGN PATENT DOCUMENTS

| JP | 4-42372 | 2/1992 |
|----|---------|--------|
| JP | 7-86886 | 3/1995 |
| JP | 7-306897 | 11/1995 |
| JP | 3033091 | 2/2000 |
| JP | 2003 16122 | 1/2003 |
| JP | 2004-220223 | 8/2004 |

* cited by examiner

*Primary Examiner*—Thuan Do
(74) *Attorney, Agent, or Firm*—Frommer Lawrence & Haug LLP; William S. Frommer; Thomas F. Presson

(57) ABSTRACT

A skeleton generation method includes: creating a netlist which is a circuit connection information input file format for analog circuit simulation, as subcircuit descriptions corresponding to function blocks of a system, on the basis of input and output information on the function blocks; constructing a function block skeleton of a system level design language using the respective subcircuit descriptions as units of the function blocks, on the basis of the circuit connection information described in the netlist; and constructing a system skeleton on the basis of a result of analysis of connection information on nodes of the subcircuit descriptions.

18 Claims, 11 Drawing Sheets

FIG. 4

| | |
|---|---|
| L401: | Example 1: Bi-directional sender-receiver system |
| L402: | *Network topology |
| L403: | X1 11 0 block1 |
| L404: | X2 11 0 block2 |
| L405: | .model Node(11) Nbits = 32 Nidx = 1 |
| L406: | .model Node(0) Nbits = 32 Nidx = 1 |
| L407: | .end |

FIG. 5

```
L501: SC_MODULE(Wrapper_X1){
L502:   public:
L503:     sc_in<bool> clk;
L504:     sc_inout<unsigned int> p_io_c_11;
L505:     sc_inout<unsigned int> p_io_c_0;

~THE FOLLOWING LINES ARE OMITTED
        BECAUSE THEY ARE IRRELEVANT TO THE
        INVENTION~

L506: SC_MODULE(Wrapper_X2){
L507:   public:
L508:     sc_in<bool> clk;
L509:     sc_inout<unsigned int> p_io_c_11;
L510:     sc_inout<unsigned int> p_io_c_0;

~THE FOLLOWING LINES ARE OMITTED
        BECAUSE THEY ARE IRRELEVANT TO THE
        INVENTION~
```

```
L511: SC_MODULE(Wrapper_Top){
L512:   public:
L513:     sc_signal<unsigned int> c_11;
L514:     sc_signal<unsigned int> c_0;
L515:   private:
L516:     sc_clock* c_SystemClock;
L517:     Wrapper_X1* i_Wrapper_X1;
L518:     Wrapper_X2* i_Wrapper_X2;
L519:   public:
L520:   SC_CTOR(Wrapper_Top){
L521:     c_SystemClock = new sc_clock("Clock");
L522:     c_SystemClock->clk(c_SystemClock);
L523:     i_Wrapper_X1 = new Wrapper_X1("Wrapper_X1");
L524:     i_Wrapper_X1->clk(c_SystemClock);
L525:     i_Wrapper_X1->p_io_c11(c_11);
L526:     i_Wrapper_X1->p_io_c0(c_0);
L527:     i_Wrapper_X2 = new Wrapper_X2("Wrapper_X2");
L528:     i_Wrapper_X2->clk(c_SystemClock);
L529:     i_Wrapper_X2->p_io_c11(c_11);
L530:     i_Wrapper_X2->p_io_c0(c_0);
L531:   }
L532: }; // End of SC_MODULE
```

FIG. 7

```
Example 2: One-directional sender-receiver system

*Network topology

X3 21 0 block3

X4 22 23 block4

*Protocol definition

D1 21 22 dmodel1

D2 23 0 dmodel1

.model dmodel1 NBit = 32 Nidx = 1

.end
```

FIG. 8

```
SC_MODULE(Wrapper_X3){ // to be expanded as a class
public:
  // Definition of Ports
  sc_in<bool> clk;
  sc_out<unsigned int> p_io_c_21;
  sc_in<unsigned int> p_io_c_0;
  ~THE FOLLOWING LINES ARE OMITTED BECAUSE
  THEY ARE SUBSTANTIALLY THE SAME AS THOSE
  SHOWN IN FIG. 5 ~
```

```
SC_MODULE(Wrapper_X4){ // to be expanded as a class
public:
  // Definition of Ports
  sc_in<bool> clk;
  sc_in<unsigned int> p_io_c_22;
  sc_out<unsigned int> p_io_c_23;
  ~THE FOLLOWING LINES ARE OMITTED BECAUSE
  THEY ARE SUBSTANTIALLY THE SAME AS THOSE
  SHOWN IN FIG. 5 ~
```

FIG. 10

Example 3: Master-Slave system

*Network topology

X5 32 31 0 block5

X6 33 34 35 block6

*Protocol definition

D1 35 0 dmodel1

D2 34 31 dmodel2

D3 33 32 dmodel3

.model dmodel1 Nbits = 32 Nidx = 1

.model dmodel2 BV = 0 Nbits = 32 Nidx = 1

.model dmodel3 BV = 1 Nbits = 32 Nidx = 1

.end

FIG. 11

```
SC_MODULE(Wrapper_X5){ // to be expanded as a class
public:
    // Definition of Ports
    sc_in<bool> clk;
    sc_outslave<unsigned int> p_io_c_32;
    sc_inoutslave<unsigned int> p_io_c_31;
    sc_inslave<unsigned int> p_io_c_0;

~THE FOLLOWING LINES ARE OMITTED BECAUSE
THEY ARE SUBSTANTIALLY THE SAME AS THOSE
SHOWN IN FIG. 5~
```

```
SC_MODULE(Wrapper_X6){ // to be expanded as a class
public:
    // Definition of Ports
    sc_in<bool> clk;
    sc_inmaster<unsigned int> p_io_c_33;
    sc_inoutmaster<unsigned int> p_io_c_34;
    sc_outmaster<unsigned int> p_io_c_35;

~THE FOLLOWING LINES ARE OMITTED BECAUSE
THEY ARE SUBSTANTIALLY THE SAME AS THOSE
SHOWN IN FIG. 5~
```

SKELETON GENERATION APPARATUS AND METHOD

BACKGROUND OF THE INVENTION

1. Field of the Invention

The present invention belongs to the field of design technology for large-scale semiconductor integrated circuits containing so-called processors (SoC: System on Chip), and particularly relates to a skeleton generation apparatus and method for generating a skeleton of a system model in ESL (Electronic System Level) design for developing an electronic system adapted to realize the processing of simultaneous and concurrent behaviors of function blocks that is required in large-scale integrated circuits, by means of a system level design language from a programming language for general sequential processing used for algorithm development.

2. Description of Related Art

In general, design techniques using system level design languages make it necessary to clearly define inputs and outputs of function blocks, and in this regard differ from programming languages generally used for algorithm development, which permit various direct or indirect inputs and outputs such as global variables and pointer accesses.

To make up this difference, steady effort has been made to accomplish function blocking that performs rewriting to define inputs and outputs with arguments and return values at algorithm levels, i.e., programming language levels.

However, it is extremely difficult for a user to understand the content of processing and arrange variables on the basis of the source of a programming language which is made of various units developed and described by different programmers other than the user. Modifications at programming language levels do not offer means for detecting unexpected uses of variables, and problems are tend to be buried and not become evident, so that initial start-up takes long time.

In view of such situation, it has been proposed to provide various apparatuses and methods for converting information on hardware specifications into hardware design description languages (refer to Patent Literatures 1 to 5 by way of example).

Patent Literature 1 (Japanese Patent Application Publication Number 07-306879) discloses a netlist and hardware description conversion apparatus for generating a hardware description language source from a netlist and realizing conversion to function level design using the hardware description language.

Patent Literature 2 (Japanese Patent Application Publication Number 07-086886) discloses the technique of converting logic information representative of logic or functions in the form of lists or formulae into a hardware connection description language from the lists or the formulas.

Patent Literature 3 (Japanese Patent Application Publication Number 04-042372) discloses a logic circuit editing system which includes representation form conversion means for converting an existing logic circuit into a representation form of function level, input edit means for performing input edit of a new logic circuit by using the existing logic circuit represented in the form of function level, and database registration means for registering an objective logic circuit obtained by input edit in a database.

Patent Literature 4 (Japanese Patent Publication Number 3033091) discloses the technique of interpreting individual logic functions into a logic simulation description language while interpreting an edit command table.

Patent Literature 5 (Japanese Patent Application Publication Number 2004-220223) discloses an information processing apparatus which, on the basis of input hardware external specifications information, generates a port definition file described in a system description language, generates a port-to-port connection definition file described in the system description language, generates a port-related function definition file described in the system description language, and generates a hardware model input/output function definition file described in the system description language.

SUMMARY OF THE INVENTION

However, any of the techniques disclosed in Patent Literatures 1 to 5 is basically intended to logic (digital) circuits (or hardware) having a distinction between the directions of input and output, and has the disadvantage of being unable to construct a system by the connection of system constituent components having no prescribed directions of input and output.

In the technique disclosed in Patent Literature 1, a logic circuit is prescribed as element information, and the logic circuit has a distinction between the directions of input and output. From the circuit configuration example of the netlist shown in FIG. 2 of Patent Literature 1, it is also apparent that logic symbols are used as constituent elements and each of the logic symbols has a distinction between the directions of input and output.

The technique disclosed in Patent Literature 2 is based on the assumption that logic information is input, and the logic information has a distinction between the directions of input and output. FIG. 3 of Patent Literature 2 contains terms "Name of Output Signal" and "Name of Input Signal", and apparently makes a distinction between the directions of input and output.

The technique disclosed in Patent Literature 3 is a method of editing an existing logic circuit and has a distinction between the directions of input and output. In addition, the technique uses a truth table as added information, and the truth table is clearly a table representative of the relationship between input and output.

The technique disclosed in Patent Literature 4 is based on the assumption that graphic data on a digital circuit is input, and it is apparent from FIG. 3 of Patent Literature 4 that logic symbols are input. As mentioned previously, all logic symbols have a distinction between the directions of input and output.

In the technique disclosed in Patent Literature 5, hardware external specifications information is input, and the term "PortType" shown in FIG. 6 means a distinction between write and read, and represents the directions of input and output.

Namely, all the techniques disclosed in Patent Literatures 1 to 5 need the distinction between the directions of input and output, and none of them is based on the assumption that a system may be constructed by the connection of system constituent components having no prescribed directions of input and output, so that none of them can construct a system by the connection of system constituent components having no prescribed directions of input and output.

Accordingly, it is desirable to provide a skeleton generation apparatus and a skeleton generation method for generating a skeleton of a general-purpose system model from connection information, both of which make it possible to construct a system by the connection of system constituent components having no prescribed directions of input and output and to support function blocking of the system which is the first step in design using a system level design language. The present invention is made in view of the above.

According to a first aspect of the present invention, there is provided a skeleton generation apparatus which includes a function of creating a netlist which is a circuit connection information input file format for analog circuit simulation, as subcircuit descriptions corresponding to function blocks of a system, on the basis of input and output information on the function blocks, a function of constructing a function block skeleton of a system level design language using the respective subcircuit descriptions as units of the function blocks, on the basis of the circuit connection information described in the netlist, and a function of constructing a system skeleton on the basis of a result of analysis of connection information on nodes of the subcircuit descriptions.

According to a second aspect of the present invention, there is provided a skeleton generation apparatus which includes a function of creating a netlist which is a circuit connection information input file format for analog circuit simulation, as subcircuit descriptions corresponding to function blocks of a system, on the basis of input and output information on the function blocks, a function of constructing a function block skeleton of a system level design language using the respective subcircuit descriptions as units of the function blocks, on the basis of the circuit connection information described in the netlist, a function of checking the circuit connection information described in the netlist and detecting an unconnected node and/or a node which does not one-to-one correspond to each of a plurality of connection destinations, a function of generating a stub block having no behavior description by means of an extended option description if an unconnected node is detected, a function of converting information on the unconnected node into input and output information on the stub block, and a function of constructing a skeleton of the system on the basis of a result of analysis of connection information on nodes of the subcircuit descriptions.

According to a third aspect of the present invention, there is provided a skeleton generation method which includes: creating a netlist which is a circuit connection information input file format for analog circuit simulation, as subcircuit descriptions corresponding to function blocks of a system, on the basis of input and output information on the function blocks; constructing a function block skeleton of a system level design language using the respective subcircuit descriptions as units of the function blocks, on the basis of the circuit connection information described in the netlist; and constructing a system skeleton on the basis of a result of analysis of connection information on nodes of the subcircuit descriptions.

According to a fourth aspect of the present invention, there is provided a skeleton generation method which includes: creating a netlist which is a circuit connection information input file format for analog circuit simulation, as subcircuit descriptions corresponding to function blocks of a system, on the basis of input and output information on the function blocks; constructing a function block skeleton of a system level design language using the respective subcircuit descriptions as units of the function blocks, on the basis of the circuit connection information described in the netlist; checking the circuit connection information described in the netlist and detecting an unconnected node and/or a node which does not one-to-one correspond to each of a plurality of connection destinations; generating a stub block having no behavior description by means of an extended option description if an unconnected node is detected; converting information on the unconnected node into input and output information on the stub block; and constructing a skeleton of the system on the basis of a result of analysis of connection information on nodes of the subcircuit descriptions.

According to a fifth aspect of the present invention, there is provided a computer system for generating a system skeleton including: means for creating a netlist which is a circuit connection information input file format for analog circuit simulation, as subcircuit descriptions corresponding to function blocks of a system, on the basis of input and output information on the function blocks; means for constructing a function block skeleton of a system level design language using the respective subcircuit descriptions as units of the function blocks, on the basis of the circuit connection information described in the netlist; and means for constructing a system skeleton on the basis of a result of analysis of connection information on nodes of the subcircuit descriptions.

According to a sixth aspect of the present invention, a computer program product for use in generation of a system skeleton in a computer system, including: a recording medium; means, recorded on the recording medium, for instructing the computer system to create a netlist which is a circuit connection information input file format for analog circuit simulation, as subcircuit descriptions corresponding to function blocks of a system, on the basis of input and output information on the function blocks; means, recorded on the recording medium, for instructing the computer system to construct a function block skeleton of a system level design language using the respective subcircuit descriptions as units of the function blocks, on the basis of the circuit connection information described in the netlist; and means, recorded on the recording medium, for instructing the computer system to construct a system skeleton on the basis of a result of analysis of connection information on nodes of the subcircuit descriptions.

According to the first to sixth aspects of the present invention, a system level model skeleton equipped with a minimum amount of input and output information and described in a system level design language which is at least compilable can be obtained when function blocking is to be performed on an unfamiliar algorithm.

In addition, when an behavior model of a programming language description of, for example, algorithm level is mapped to a system level model, if the relationship between input and output is not adequately defined and an inappropriate code is present, a compilation error immediately occurs, so that the cause thereof can be easily cleared up and solved.

BRIEF DESCRIPTION OF THE DRAWINGS

FIG. 4 is a diagram showing a network description 1 of the first specific embodiment;

FIG. 5 is a diagram showing a system description automatically generated from the network description 1;

FIG. 7 is a diagram showing a network description 2 of the second specific embodiment;

FIG. 8 is a diagram showing a system description automatically generated from the network description 2;

FIG. 10 is a diagram showing a network description 3 of the third specific embodiment; and FIG. 11 is a diagram showing a system description automatically generated from the network description 3.

DETAILED DESCRIPTION OF EMBODIMENTS

An embodiment of the present invention will be described below with reference to FIGS. 1 and 2.

Figure 1:
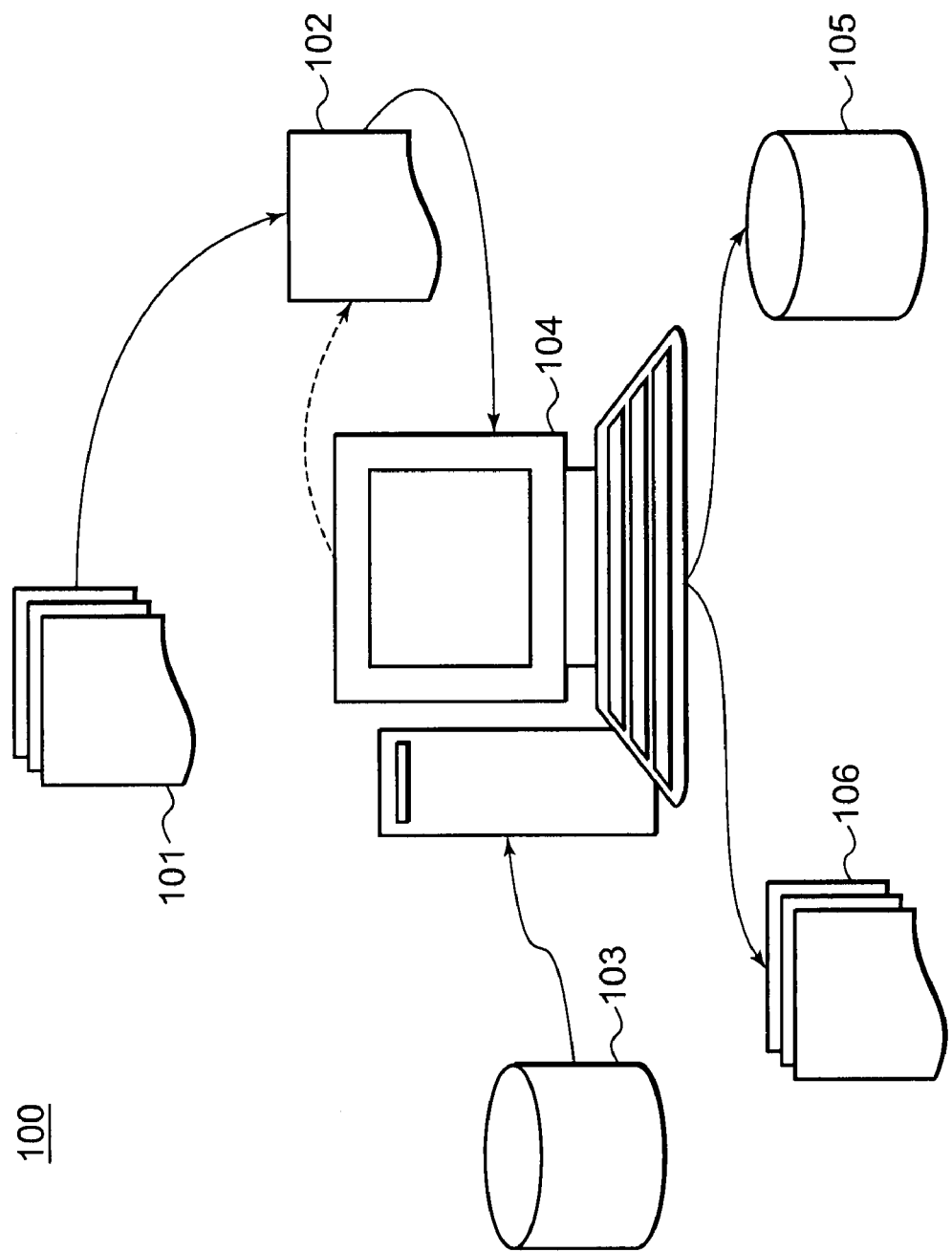
FIG. 1 is a diagram showing a configuration example of a computer system which adopts a skeleton generation apparatus according to an embodiment of the present invention.

FIG. 1 is a diagram showing a configuration example of a computer system which adopts a skeleton generation apparatus according to the embodiment of the present invention.

A system generally denoted by 100 uses a netlist which is a circuit connection information file format for analog circuit simulation and enables simulatory system specifications to be examined and constructed with a system level design language. The system 100 has the function of describing individual function blocks of the system 100 as subcircuits and generating a connection information description of the entire system represented by the system level design language on the basis of the input of the subcircuit description.

Specifically, the system 100 has the input of the function block specifications of the system described as a netlist 102 which is a circuit connection information input file format for analog circuit simulators, i.e., refined targets 101 described in an algorithm level programming language.

An execution function 103 of the embodiment is stored on a distributable recording medium, and is loaded into and executed by an electronic computer processing system 104 in response to a command from a user.

The netlist 102 may be prepared by a method such as generation from an argument analysis of the refined targets 101, direct preparation by the user with a text editor, or modification of, for example, an intermediate netlist automatically generated from an argument analysis of the refined targets 101, by means of a schematic editor having a GUI.

In the system 100, an internal format database 105 which is processed and generated by the execution function 103 of the embodiment on the basis of the input of the netlist 102 defined at each stage of design during the examination is subjected to a syntax analysis by the execution function 103, and after having been closely examined by a plurality of check functions, an ESL system level skeleton is outputted which is the final output of the execution function 103.

Figure 2:
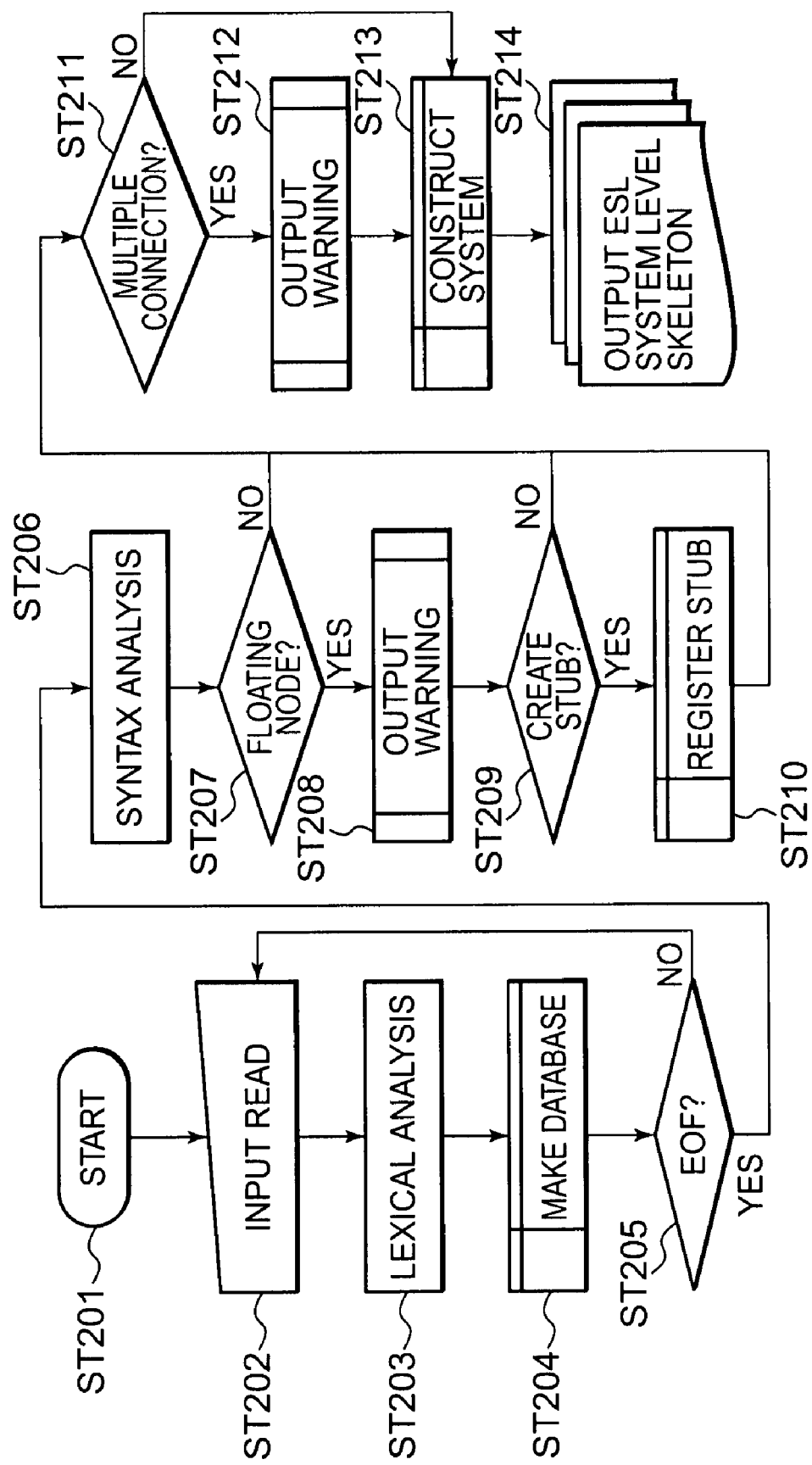
FIG. 2 is a flowchart showing the processing of an execution function according to the embodiment of the present invention.

FIG. 2 is a flowchart showing the processing of the execution function 103 according to the embodiment of the present invention.

The content of the execution function 103 will be described below in detail with reference to the flowchart shown in FIG. 2.

When the execution function 103 is started (ST201), the netlist 102 is read line by line (ST202).

The information which is stored line by line in the inside of the electronic computer processing system 104 is subjected to lexical analysis in order from the first character (ST203), and is stored into the database 105 in an intermediate format in the inside of the drawing processing section 104 according to the content of the lexical analysis (ST204).

Specifically, an analysis is performed on how many tokens the read line is made of as well as whether an unpermitted token exits in the read line.

If the content of the read line signifies the end of a file or a read end command in an end-of-input-read decision step ST205, the process proceeds to step ST206 for syntax analysis of the content stored in the database 105.

In the syntax analysis step ST206, the relationship between tokens is analyzed. Specifically, analysis is performed on property information such as the names of modules used and the number and types of ports, information on connection to nodes, and the like. At the same time, semantic analysis is performed on the connection topology of the modules, the width of each port through which current flows to or from any of the nodes, the number of elements, and the like, so that a database for each of the nodes is made. When the result is stored into the database 105, the syntax analysis is completed.

The stored data is scanned to check whether a floating node exits (ST207), and if a floating node exits, a warning is outputted (ST208).

Furthermore, how to handle the floating node can be selected (ST209), and if the floating node is requested to be connected to a stub, the floating node is registered as a stub node (ST210).

In this case, if the input and output of an unconnected function block cannot be neglected, a stub block to which the node is to be connected is created by option description.

Furthermore, option commands are used to control whether the stub block is to be created in the system as a single block so that new input and output information are added to all related hierarchical blocks, or whether the stub block is to be created in a certain layer so that a plurality of stub blocks are generated in the system, or whether the stub block is to be connected to a reference node, or the like.

Then, whether one node is used by at least three ports, i.e., the presence or absence of multiple connections, is scanned (ST211).

If it is determined in step ST211 that multiple connection is present, a warning is outputted (ST212).

In this flowchart, the presence or absence of a floating node and that of multiple connection are separately scanned, but since these scanning operations can be regarded as the same in terms of scanning for node information, a different implementation may be adopted, such as selectively switching these two kinds of behaviors according to the result of scanning.

When a topology check which is needed to prevent a critical error is completed, construction of the system is started (ST213).

During the system construction, the final topology check is performed. Specifically, it is checked whether a node or the like exists between channels.

If the result of the semantic analysis indicates that a valid ESL system model skeleton can be generated, this ESL system model skeleton (often called "wrapper") is outputted (ST214).

The above-mentioned configuration and functions will become far more apparent from the following description of other embodiments and drawings which are not to be construed in a limiting sense.

More specific embodiments of the present invention will be described below with reference to FIGS. 3 to 11.

First Specific Embodiment

The most basic system network can be constructed as a bi-directional sender-receiver relationship.

Figure 3:
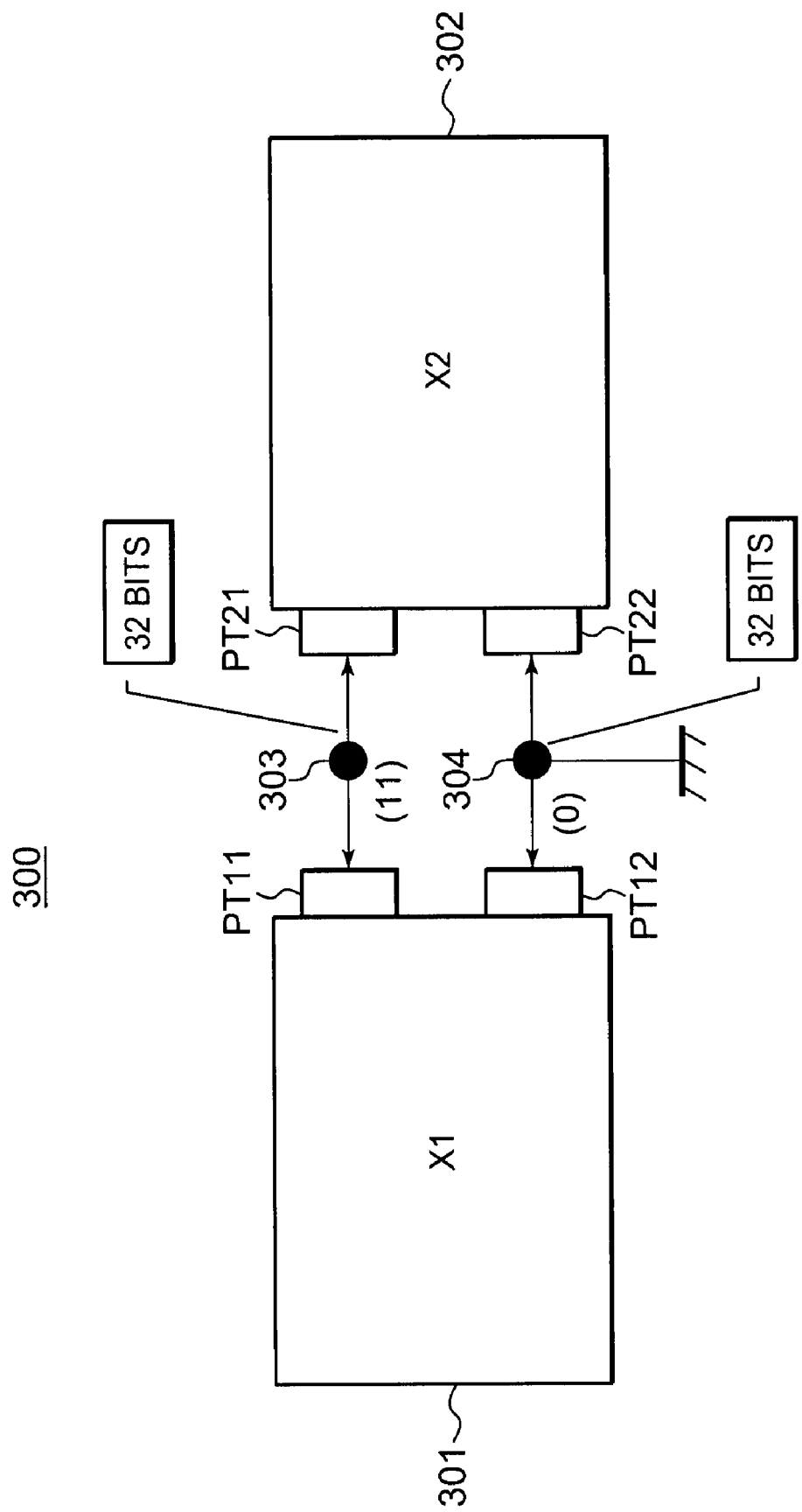
FIG. 3 is a diagram showing a configuration example of a bi-directional sender-receiver system according to a first specific embodiment.

FIG. 3 is a diagram showing a configuration example of a bi-directional sender-receiver system.

A system 300 according to the first specific embodiment has a function block (X1) 301 and a function block (X2) 302.

The respective function blocks (X1) 301 and (X2) 302 have two ports PT11 and PT12 and two ports PT21 and PT22.

The port PT11 and the port PT21 are connected to each other by a common node (11) 303, while the port PT12 and the port PT22 are connected to each other by a common ground node (0) 304. Each of the ports PT11, PT12, PT21 and PT22 has a port width of 32 bits.

A netlist representative of the circuit diagram shown in FIG. 3 is a network description 1 of the first specific embodiment shown in FIG. 4. The meaning of the netlist shown in FIG. 4 will be described below with reference to the execution flowchart shown in FIG. 2.

If the skeleton generation apparatus according to the embodiment of the present invention is started (ST201), the input read step ST202 is started to read the first line.

The first line (L401 in the specific embodiment shown in FIG. 4) is necessarily a title line, and the entire character string is recognized as a title by the lexical analysis step ST2. A token check is not performed.

In the first specific embodiment, the title is "Example 1: Bi-directional sender-receiver system", and is stored into the database.

In the end-of-input-read decision step ST205, it is not determined that the reading of this line has been completed, and the input read step ST202 is again executed.

In the lexical analysis step ST203, since an asterisk (*) is placed at the head of the second line (L403), the second line (L403) is recognized as a comment line. Accordingly, the character string in the second line from the head to the end is handled as a comment by the processing system. Specifically, the second line is neglected, and nothing is stored into the database step ST204.

Subsequently, the loop of steps ST202 to ST205 is repeated in a similar manner until the end of input read is detected in the end-of-input-read decision step ST205.

The third line (L403) is an element description line. The character "X" placed at its head signifies a subcircuit description, and since there are no tokens having invalid entries, all characters of the third line (L403) are stored into the database.

Subsequently, all remaining lines inclusive of the last line (L407) are stored into the database. The L407 line signifies the end of input read, and the syntax analysis step ST206 is started.

In the syntax analysis step ST206, topological information on the function block (X1) 301 and the function block (X2) 302 is constructed.

The line L403 states that the function block (X1) 301 has two ports connected to the respective nodes (11) 303 and (0) 304. Node number 0 is a special number, which represents a ground node in any case. The function block (X1) 301 is an instance created from a subcircuit named block1.

The line L404 states that the function block (X2) 302 has two ports connected to the respective nodes (11) 303 and (0) 304. The function block (X2) 302 is an instance created from a subcircuit named block2.

In the line L405, the node having node number 11 is modeled. The node (11) 303 is a node of 32-bit bit width with the number of elements=1.

In the line L406, the ground node of node number 0 is modeled. The node (0) 304 is a node of 32-bit bit width with the number of elements=1. In the case of the SPICE circuit simulator, the ground node is normally numbered 0 and assigned a signal value of 0, but the skeleton generation apparatus according to the embodiment of the present invention does not use information indicating that the signal value of the ground node is 0. Thus, all syntax analysis steps are completed.

After the topology of the circuit is specified, a check step for checking whether an invalid topology is absent is executed.

First, the process proceeds to the check step ST207 for checking a floating node. In the first specific embodiment, since a floating node is absent, the process proceeds to the multiple connection check step ST211. In the first specific embodiment, each of the nodes serves to provide one-to-one connection between element ports, so that multiple connections is absent.

After the information necessary for skeleton output has been prepared, the system construction step ST213 is executed.

In step ST213, translation and conversion into a system level design language are performed.

Specifically, the system is constructed while referring to a translation-and-conversion template database conforming to the grammar of a system level design language to be used. The system constructed is consistently grammatically correct and is represented by a compilable and executable description.

Finally, in the ESL system level skeleton output step ST214, the obtained skeleton is outputted in an ESL system level design language file format.

In the first specific embodiment, the directions of the nodes 303 and 304 are not specified: that is to say, all blocks are constructed in a bi-directional sender-receiver relationship.

In the first specific embodiment, only the nodes are specified, and the directions of signals between the nodes are not determined. In addition, since the direction of control is not fixed, either of the blocks may serve as a master or a slave.

Accordingly, in the ESL system level skeleton output step ST214, a skeleton is outputted in which the direction of control is not statically determined but can be determined during execution.

In the first specific embodiment, a processing function, which enables the direction of control to be determined during execution without the need to statically determine the direction of control, can be realized by any method.

FIG. 5 shows an output example of an ESL system level skeleton created by using SystemC. In FIG. 5, lines L501 to L505 provide module definitions.

The function block X1 specified by the line L403 in FIG. 4 is converted to the SystemC module name "Wrapper_X1" along with the modification string "Wrapper_".

The line L502 is an access specifier of the C++ language, which specifies the following description as public access members.

The line L503 represents a clock declaration, but this part depends on modeling techniques and may also be omitted.

The respective lines L504 and L505 represent port declarations corresponding to the skeleton according to the first specific embodiment. Since the input and output directions of the respective ports cannot be determined during model description, both ports are defined as input/output ports.

Lines L506 to L510 provide the module definitions of the function block X2 specified by the line L404 in FIG. 4. Similarly to the function block X1, the function block X2 is converted to the SystemC module name "Wrapper_X2".

The first specific embodiment is characterized in that the L507-L510 descriptions for the X2 module and the L502-L505 descriptions for the X1 module are completely the same, so that the module definitions can be extremely simply described. Lines L511 to L532 provide the instance definitions of the entire system. In the lines L513 and L514, the nodes 303 and 304 shown in FIG. 4 are expanded into channels.

To be brief, the first specific embodiment does not at all specify the directions of input and output or signals nor the direction of control, so that the first specific embodiment can be used for mapping algorithm-level variables to individual ports without regard to the flows of signals and constructing a system while taking only connection destinations into consideration.

Second Specific Embodiment

A uni-directional sender-receiver relationship can be represented by inserting a diode description between nodes.

Figure 6:
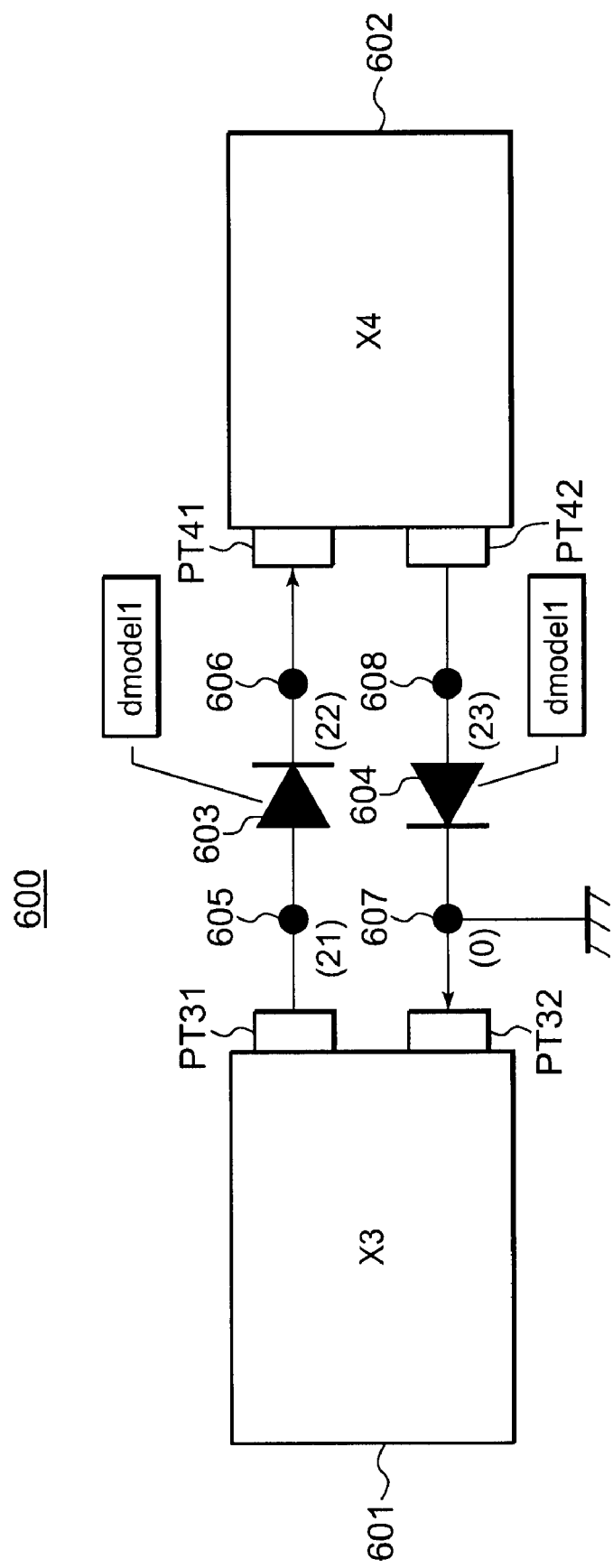
FIG. 6 is a diagram showing a configuration example of a uni-directional sender-receiver system according to a second specific embodiment.

FIG. 6 is a diagram showing a configuration example of a uni-directional sender-receiver system.

A system 600 according to the second specific embodiment has a function block (X3) 601 and a function block (X4) 602.

The respective function blocks (X3) 601 and (X4) 602 have two ports PT31 and PT32 and two ports PT41 and PT42. In FIG. 6, reference numerals 603 and 604 denote diodes, respectively.

The port P31 of the function block (X3) 601 is connected to a node (21) 605, and the port PT41 of the function block (X4) 602 is connected to a node (22) 606. The port P32 of the function block (X3) 601 is connected to a node (0) 607, and the port PT42 of the function block (X4) 602 is connected to a node (23) 608.

The node (21) 605 and the node (22) 606 are connected to each other by the diode 603. The anode side of the diode 603 is connected to the node (21) 605, while the cathode side of the diode 603 is connected to the node (22) 606. Accordingly, the flow direction of signals from the node (21) 605 to the node (22) 606 is specified.

The node (0) 607 and the node (23) 608 are connected to each other by the diode 604. The cathode side of the diode 604 is connected to the node (0) 607, while the anode side of the diode 604 is connected to the node (23) 608. Accordingly, the flow direction of signals from the node (23) 608 to the node (0) 607 is specified. Each of the ports PT31, PT32, PT41 and PT42 has a port width of 32 bits.

FIG. 7 shows a network description 2 of the second specific embodiment. The second specific embodiment differs from the first specific embodiment in that a diode is inserted between nodes and the model of the inserted diode is described instead of the models of the respective nodes.

Since the model of the diode is described, the models of the respective nodes located on the opposite sides of the diode need not be described, so that simple description can be realized.

FIG. 8 shows an output example of an ESL system level skeleton created by using SystemC. Since a diode is inserted in the input netlist, signal input and signal output are assigned to individual ports of the skeleton output.

To be brief, the second specific embodiment specifies the directions of input and output, i.e., signals, so that the second specific embodiment can be used for modeling the flows of signals in a data flow model. Since the direction of control is not specified, it is possible to perform modeling without determining whether to transmit or receive data.

Third Specific Embodiment

When a master-slave relationship is to be clearly described, a diode description is inserted between nodes and a model description is used to define the direction of control.

Figure 9:
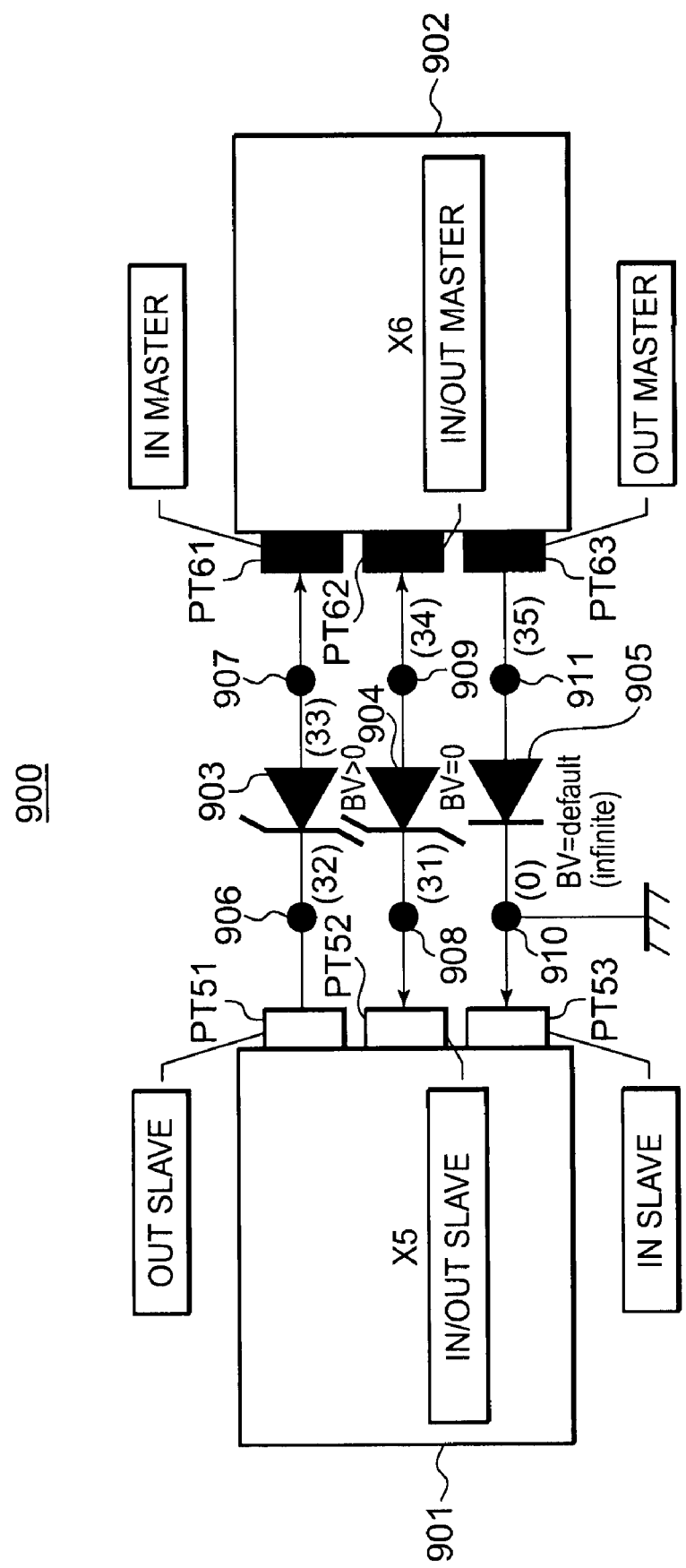
FIG. 9 is a diagram showing a configuration example of a master-slave system according to a third specific embodiment.

FIG. 9 is a diagram showing a configuration example of a master-slave system.

A system 900 according to the third specific embodiment has a function block (X5) 901 and a function block (X6) 902.

The respective function blocks (X5) 901 and (X6) 902 have three ports PT51 to PT53 and three ports PT61 to PT63. In FIG. 9, reference numerals 903 and 904 denote Zener diodes, respectively, and reference numeral 905 denotes a diode.

The port P51 of the function block (X5) 901 is connected to a node (32) 906, the port PT52 is connected to a node (31) 908, and the port PT53 is connected to a node (0) 910.

The port P61 of the function block (X6) 902 is connected to a node (33) 907, the port PT62 is connected to a node (34) 909, and the port PT63 is connected to a node (35) 911.

The node (32) 906 and the node (33) 907 are connected to each other by the Zener diode 903. The anode side of the Zener diode 903 is connected to the node (33) 907, while the cathode side of the Zener diode 903 is connected to the node (32) 906. Accordingly, the flow direction of control from the node (33) 907 to the node (32) 906 is specified. Since the index BV for the Zener diode 903 represents a positive breakdown voltage, the flow direction of control from the node (32) 906 to the node (33) 907 is specified.

The node (31) 908 and the node (34) 909 are connected to each other by the Zener diode 904. The anode side of the Zener diode 904 is connected to the node (34) 909, while the cathode side of the Zener diode 904 is connected to the node (31) 908. Accordingly, the flow direction of control from the node (34) 909 to the node (31) 908 is specified. Since the index BV for the Zener diode 904 represents a breakdown voltage of 0V, the bi-directional flow of signals is specified.

In FIG. 9, if the settings of the breakdown voltages are not shown, the visual representations of the two Zener diodes 903 and 904 are completely the same. Namely, the use of the Zener diodes in the skeleton generation apparatus according to the third specific embodiment merely represents the possibility that the direction of control does not coincide with the directions of signals. If a clear distinction between the Zener diodes is needed, their breakdown voltages may be described.

The node (0) 910 and the node (35) 911 are connected to each other by the diode 905. The anode side of the diode 905 is connected to the node (35) 911, while the cathode side of the diode 905 is connected to the node (0) 910. Accordingly, the flow direction of control from the node (35) 911 to the node (0) 910 is specified.

One model is not permitted to have ports having different degrees of abstraction, so that in the third specific embodiment the directions of signals with respect to these ports are also specified. Namely, the flow direction of signals from the node (35) 911 to the node (0) 910 is specified.

To clearly describe the flow direction of signals as opposed to the description example of the second specific embodiment in which the direction of control is not specified, the breakdown voltage may be left as a default instead of being set, or the breakdown voltage may be set to a negative value, which becomes an invalid values in a circuit simulation.

The second specific embodiment and the third specific embodiment differ in that the flow directions of signals are specified by the directions of the diodes (the directions thereof from the anodes to the cathodes) (the second specific embodiment), whereas the flow directions of control are specified by the directions of the diodes (the third specific embodiment).

To settle such difference, in the third specific embodiment as well, the directions of the diodes may be defined by the directions of control, and the directions of control may be defined by the value of the breakdown voltage BV.

FIG. 10 shows a network description 3 of the third specific embodiment. Only the difference between the third specific embodiment and the second specific embodiment resides in the settings of breakdown voltages in the diode models.

FIG. 11 shows an output example of an ESL system level skeleton created by using SystemC. Master-slave information is added by the setting of breakdown voltage in each of the models.

As is apparent from the third specific embodiment, a general master-slave system can also be represented.

As described above, according to the specific embodiments, there is provided a skeleton generation apparatus which includes a function of creating a netlist which is a circuit connection information input file format for analog circuit simulation, as subcircuit descriptions corresponding to function blocks of a system, on the basis of input and output information on the function blocks, a function of reading the netlist, a function of checking circuit connection information described in the read netlist, a function of detecting an unconnected node and issuing a warning, a function of detecting a node which does not one-to-one correspond to each of a plurality of connection destinations and issuing a warning, a function of constructing a function block skeleton of a system level design language description using the respective function blocks as the subcircuit descriptions, on the basis of the circuit connection information described in the netlist, a function of outputting the function block skeleton, a function of converting node information of the subcircuit descriptions into input and output information on the function blocks, a function of outputting the input and output information on the function blocks, a function of generating an input and output process template for the function blocks from the node information of the subcircuit descriptions, a function of outputting the input and output template, a function of generating a stub block having no behavior description by means of an extended option description if an unconnected node is detected, a function of converting information on the unconnected node into input and output information on the stub block, and a function of outputting the input and output information on the stub block. Accordingly, according to the specific embodiments, it is possible to achieve the following advantages.

It is possible to realize a model description with a far higher degree of abstraction, which does not specify the directions of signals or control.

Since not the ports of function blocks but nodes which are images of parameters can be defined, it is possible to realize a skeleton generation apparatus and method advantageously suitable for design which permits easy conversion from an algorithm level and is far more oriented to network topology design.

It is possible not only to generate wrappers for a set of hardware objects seen from general software, but also to automatically generate a wrapper for the entire system.

In addition, it is possible to easily form layers and generate wrappers for only subblocks, so that it is not necessary to reconstruct the entire system only for the purpose of a merely partial modification. In addition, it is likewise possible to automatically generate test bench templates for individual subblocks.

In addition, it is possible to select how to handle floating nodes and multiple nodes.

The SPICE netlist is used as a prototype so that a simple and easy-to-understand structure can be provided, and since the direction of control or signals is designed by using diodes, an intuitive and easy-to-understand behavior can be provided.

It is possible to use an existing stable schematic editor with an established reputation as an entry point, and furthermore, a user can graphically confirm connection information on a system with his/her eyes by means of a schematic editor on the basis of a netlist generated by a text editor or from an argument analysis of an refined target algorithm.

The present application contains subject matter related to Japanese Patent Application JP 2006-143662 filed in the Japanese Patent Office on May 24, 2006, the entire content of which being incorporated herein by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A skeleton generation apparatus for constructing a system skeleton of a system having more than one function block, comprising:
    a function of creating a netlist in an algorithm level programming language for analog circuit simulation corresponding to function blocks of the system on the basis of input and output information on the function blocks;
    a function of constructing a function block skeleton of the system in a system level design language format on the basis of circuit connection information described in the netlist; and
    a function of constructing the system skeleton described in the system level design language format on the basis of a result of analysis of connection information on nodes included in the netlist,
    wherein the netlist is in an algorithm level programming language suitable for a circuit simulation, and the system skeleton represents a connection information description of the entire system.

2. A skeleton generation apparatus according to claim 1, further comprising:
    a function of converting the node information included in the netlist into input and output information on the function blocks.

3. A skeleton generation apparatus according to claim 1, further comprising:
    a function of generating input and output process templates for the function blocks from the node information included in the netlist.

4. A skeleton generation apparatus according to claim 1, further comprising:
    a check function of checking the circuit connection information described in the netlist.

5. A skeleton generation apparatus according to claim 1, further comprising:
    a function of detecting a node, including the node selected from the group consisting of:
    an unconnected node, and
    a node which does not one-to-one correspond to each of a plurality of connection destinations.

6. A skeleton generation apparatus according to claim 1, further comprising:
    a function of generating a stub block having no behavior description by means of an extended option description if an unconnected node is detected.

7. A skeleton generation apparatus according to claim 1, further comprising:
    a function of converting information on the unconnected node into input and output information on the stub block.

8. The skeleton generation apparatus of claim 1, wherein the skeleton generation apparatus further comprises:

the netlist, wherein the netlist includes circuit connection information as subcircuit descriptions corresponding to the function blocks of the system;

the function of constructing the function block skeleton, wherein the function uses the respective subcircuit descriptions as units of the function blocks; and the function of constructing the system skeleton, wherein the function includes analysis of connection information on nodes of the subcircuit descriptions.

9. A skeleton generation apparatus for constructing a system skeleton of a system having more than one function blocks, comprising:

a function of creating a netlist in an algorithm level programming language format for analog circuit simulation corresponding to function blocks of the system, on the basis of input and output information on the function blocks;

a function of constructing a function block skeleton in a system level design language format on the basis of circuit connection information described in the netlist;

a function of checking the circuit connection information described in the netlist and detecting an unconnected node;

a function of generating a stub block having no behavior description by means of an extended option description if an unconnected node is detected;

a function of converting information on the unconnected node into input and output information on the stub block; and a function of constructing the system skeleton of the system in the system level design language format on the basis of a result of analysis of connection information on nodes included in the netlist, wherein the netlist is in an algorithm level programming language is suitable for a circuit simulation, and the system skeleton represents a connection information description of the entire system.

10. The skeleton generation apparatus of claim 9, wherein the skeleton generation apparatus further comprises:

the netlist, wherein the netlist includes circuit connection information as subcircuit descriptions corresponding to the function blocks of the system;

the function of constructing the function block skeleton, wherein the function uses the respective subcircuit descriptions as units of the function blocks; and the function of constructing the system skeleton, wherein the function includes analysis of connection information on nodes of the subcircuit descriptions.

11. A skeleton generation method operated by a computer system for constructing a system skeleton of a system having more than one function blocks, comprising:

a step of creating a netlist in an algorithm level programming language format for analog circuit simulation corresponding to function blocks of the system on the basis of input and output information on the function blocks;

a step of constructing a function block skeleton of the system in a system level design language format on the basis of circuit connection information described in the netlist; and a step of constructing the system skeleton of the system described in the system level design language format on the basis of a result of analysis of connection information on nodes included in the netlist, wherein the netlist is in an algorithm level programming language is suitable for a circuit simulation, and the system skeleton represents a connection information description of the entire system.

12. The skeleton generation method of claim 11, wherein the skeleton generation method further comprises:

the netlist, wherein the netlist includes circuit connection information as subcircuit descriptions corresponding to the function blocks of the system;

the step of constructing the function block skeleton, wherein the step uses the respective subcircuit descriptions as units of the function blocks; and the step of constructing the system skeleton, wherein the step includes analysis of connection information on nodes of the subcircuit descriptions.

13. A skeleton generation method operated by a computer system for constructing a system skeleton of a system having more than one function blocks, comprising:

a step of creating a netlist in an algorithm level programming language format for analog circuit simulation corresponding to function blocks of the system on the basis of input and output information on the function blocks;

a step of constructing a function block skeleton of the system in a system level design language format on the basis of circuit connection information described in the netlist;

a step of checking the circuit connection information described in the netlist and detecting an unconnected node;

a step of generating a stub block having no behavior description by means of an extended option description if an unconnected node is detected;

a step of converting information on the unconnected node into input and output information on the stub block; and a step of constructing the system skeleton of the system described in the system level design language format on the basis of a result of analysis of connection information on nodes included in the netlist, wherein the netlist is in an algorithm level programming language suitable for a circuit simulation, and the system skeleton represents a connection information description of the entire system.

14. The skeleton generation method of claim 13, wherein the skeleton generation method further comprises:

the netlist, wherein the netlist includes circuit connection information as subcircuit descriptions corresponding to the function blocks of the system;

the step of constructing the function block skeleton, wherein the step uses the respective subcircuit descriptions as units of the function blocks; and the step of constructing the system skeleton, wherein the step includes analysis of connection information on nodes of the subcircuit descriptions.

15. A computer system for generating a system skeleton of a system having more than one function blocks, comprising:

means for creating a netlist in an algorithm level programming language format for analog circuit simulation corresponding to function blocks of the system on the basis of input and output information on the function blocks;

means for constructing a function block skeleton of the system in a system level design language format on the basis of circuit connection information described in the netlist; and means for constructing the system skeleton described in the system level design language format on the basis of a result of analysis of connection information on nodes included in the netlist, wherein the netlist is in an algorithm level programming language suitable for a circuit simulation, and the system skeleton represents a connection information description of the entire system.

16. The computer system of claim 15, wherein the computer system further comprises:
- the netlist, wherein the netlist includes circuit connection information as subcircuit descriptions corresponding to the function blocks of the system;
- the means for constructing the function block skeleton, wherein the means uses the respective subcircuit descriptions as units of the function blocks; and
- the means for constructing the system skeleton, wherein the means includes analysis of connection information on nodes of the subcircuit descriptions.

17. A computer program product executed by a computer system for generating a system skeleton of a system having more than one function blocks, comprising:
- a recording medium;
- means, recorded on the recording medium, for instructing the computer system to creating a netlist in an algorithm level programming language format for analog circuit simulation corresponding to function blocks of the system on the basis of input and output information on the function blocks;
- means, recorded on the recording medium, for instructing the computer system to construct a function block skeleton of the system in a system level design language format on the basis of circuit connection information described in the netlist; and
- means, recorded on the recording medium, for instructing the computer system to construct the system skeleton described in the system level design language format on the basis of a result of analysis of connection information on nodes included in the netlist,
- wherein the netlist is in an algorithm level programming language suitable for a circuit simulation, and the system skeleton represents a connection information description of the entire system.

18. The computer program product of claim 17, wherein the computer program product further comprises:
- the netlist, wherein the netlist includes circuit connection information as subcircuit descriptions corresponding to the function blocks of the system;
- the means for constructing the function block skeleton, wherein the means uses the respective subcircuit descriptions as units of the function blocks; and
- the means for constructing the system skeleton, wherein the means includes analysis of connection information on nodes of the subcircuit descriptions.

* * * * *